(12) United States Patent
Fan et al.

(10) Patent No.: US 7,158,382 B2
(45) Date of Patent: Jan. 2, 2007

(54) UNINTERRUPTIBLE POWER SUPPLY SOCKET

(75) Inventors: Ying-Yi Fan, Taipei (TW); Mou-Tang Lian, Taipei (TW)

(73) Assignee: Powercom Co., Ltd., Chung-Ho (TW)

( * ) Notice: Subject to any disclaimer, the term of this patent is extended or adjusted under 35 U.S.C. 154(b) by 91 days.

(21) Appl. No.: 10/660,548

(22) Filed: Sep. 12, 2003

(65) Prior Publication Data

US 2005/0057879 A1    Mar. 17, 2005

(51) Int. Cl.
*H05K 7/20* (2006.01)
(52) U.S. Cl. .................. 361/715; 361/796; 361/824; 361/790; 439/654; 439/656
(58) Field of Classification Search ................. 361/715, 361/800, 752, 797, 824, 796, 790, 685; 439/654–656
See application file for complete search history.

(56) References Cited

U.S. PATENT DOCUMENTS

| 5,606,489 | A  | * | 2/1997  | Heidorn et al. ............. 361/824 |
| 5,899,761 | A  | * | 5/1999  | Crane et al. ................. 439/142 |
| 6,650,027 | B1 | * | 11/2003 | Ho ............................... 307/66 |
| 6,775,715 | B1 | * | 8/2004  | Spitaels et al. ................ 710/8 |

\* cited by examiner

*Primary Examiner*—Kamand Cuneo
*Assistant Examiner*—Hung S. Bui
(74) *Attorney, Agent, or Firm*—Chauncey B. Johnson, Esq; Johnson & Associates, P.C.

(57) ABSTRACT

An uninterruptible power supply (UPS) socket of the present invention consists of a front panel, an upper cover, a socket member, a wiring insulation plate, a battery set, a print circuit board assembly, a detachable lower cover, a power cord lead and several components. The upper and lower covers are connected via several electric conductive wires, and said print circuit board assembly contains a power circuit board, a control circuit board and a surge protection circuit board.

3 Claims, 7 Drawing Sheets

Figure 1:
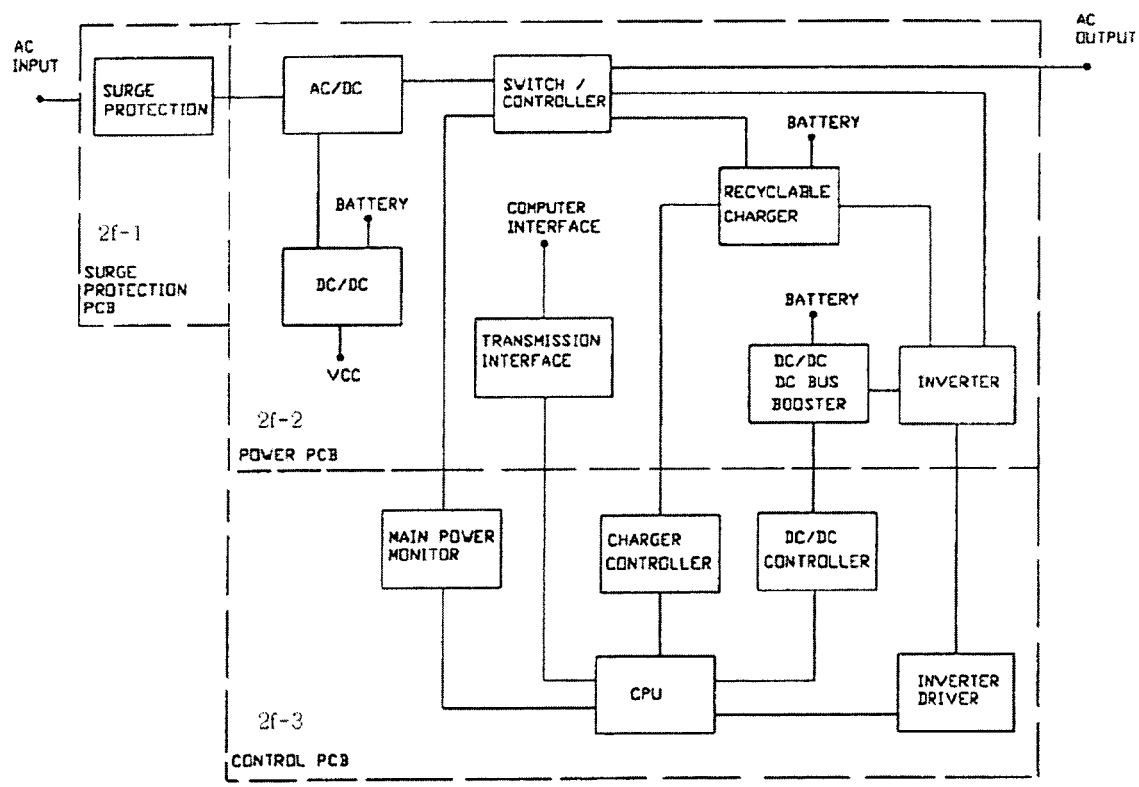
Figure 2:
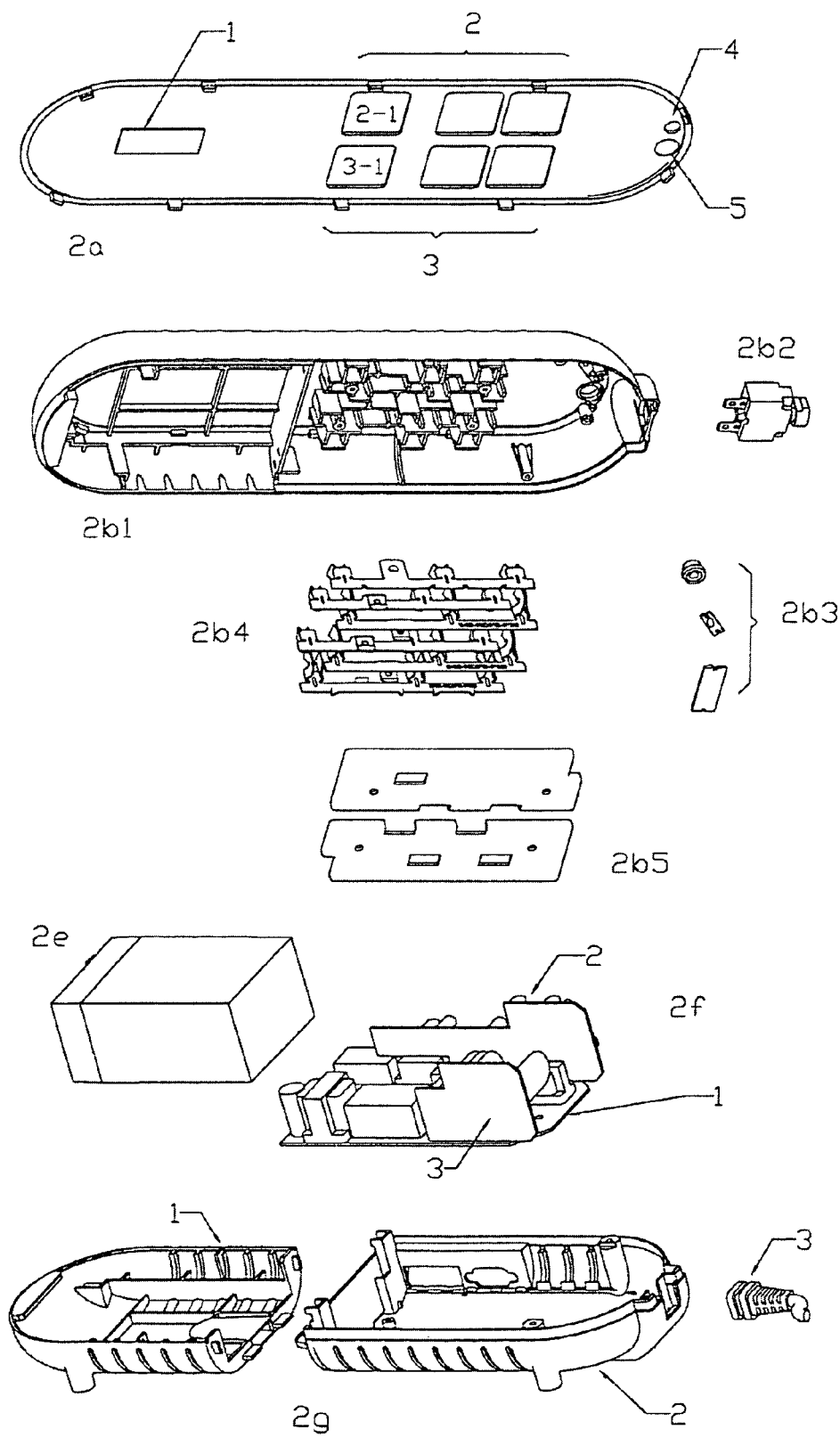
Figure 3:
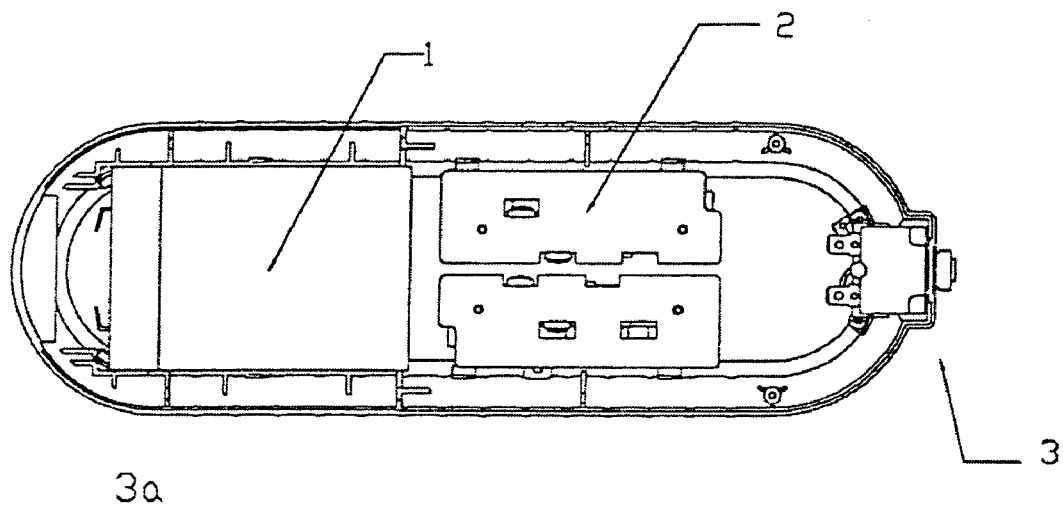
Figure 3:
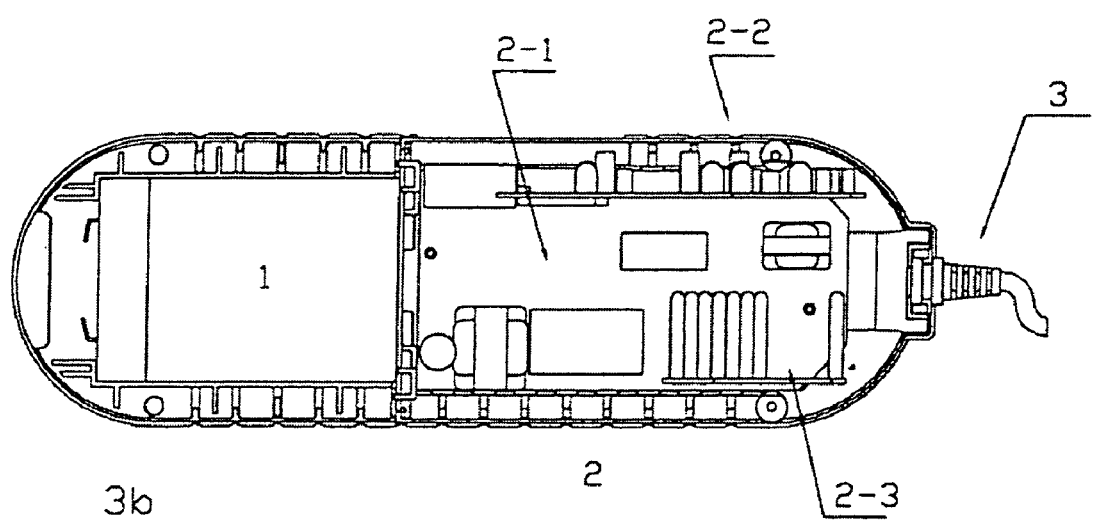
Figure 4:
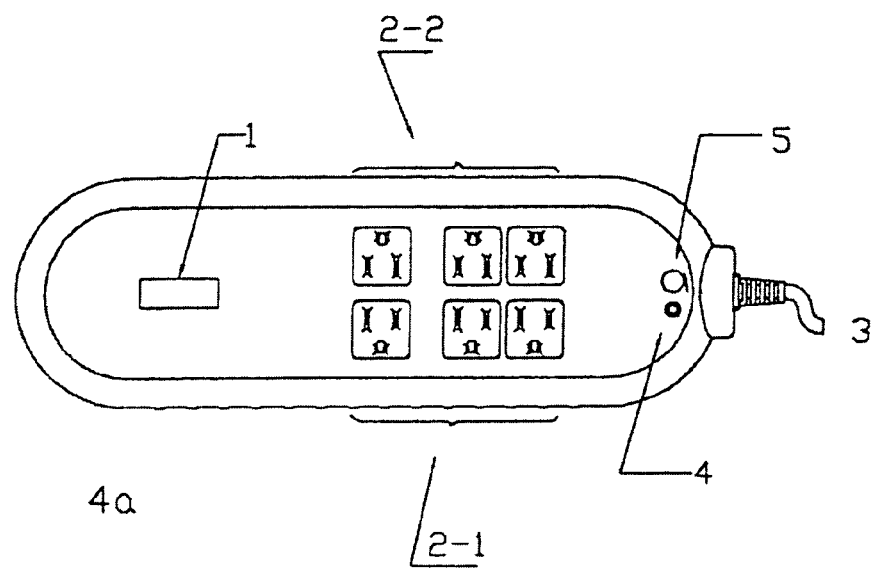
Figure 4:
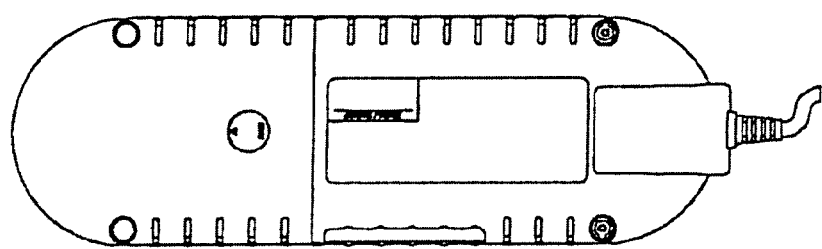
Figure 4:
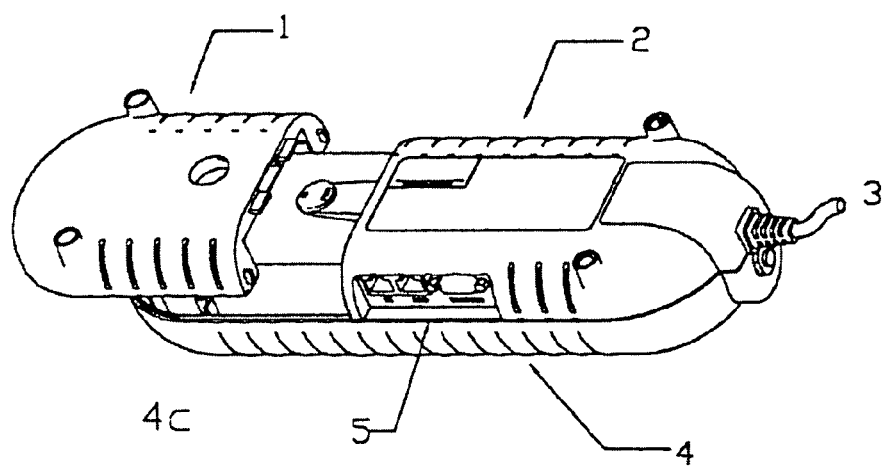
Figure 5:
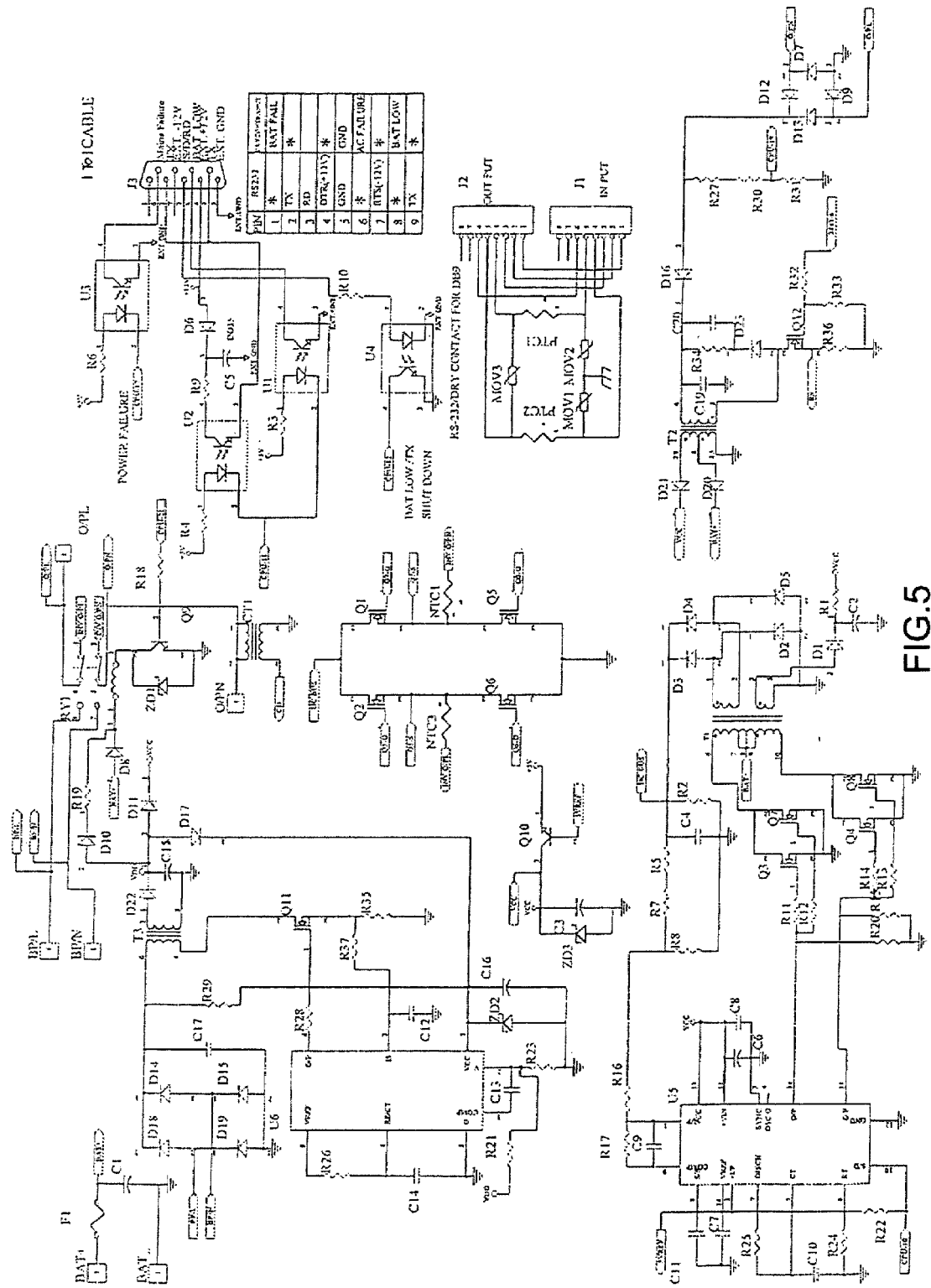
Figure 6:
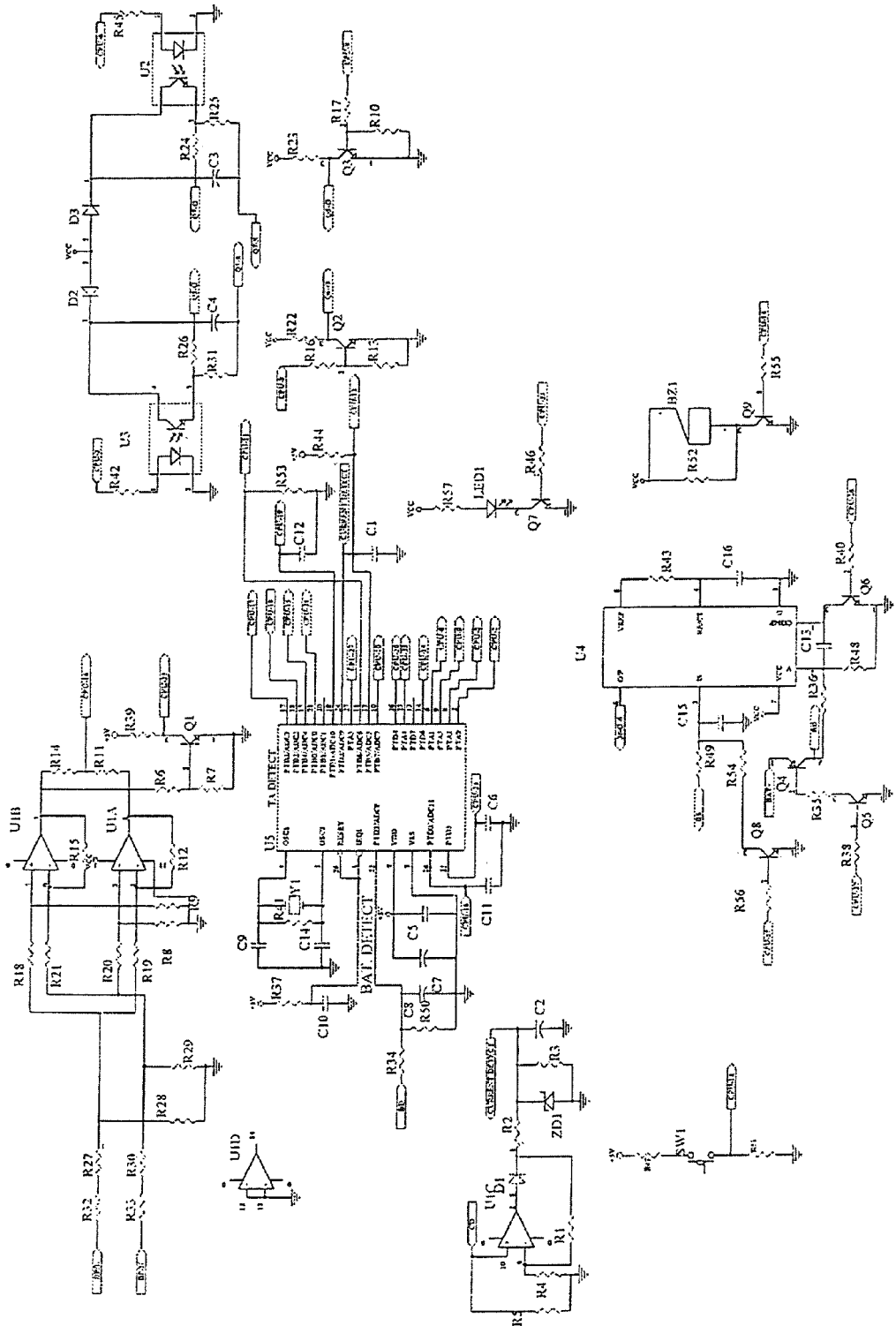
Figure 7:
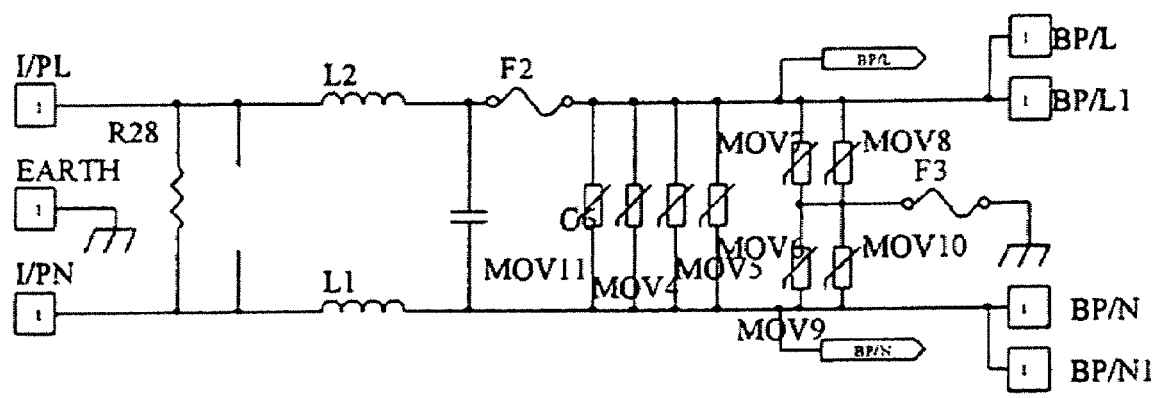

US 7,158,382 B2
                                                    1                                                                  2
         UNINTERRUPTIBLE POWER SUPPLY                                  These and other features and advantages of the various
                   SOCKET                                           aspects of the present invention will become more apparent
                                                                    upon reading the following description of a preferred exem-
                FIELD OF THE INVENTION                              plified embodiment of the present invention and upon ref-
                                                                 5  erence to the accompanying drawings.
   The present invention relates to an uninterruptible power
supply (UPS) device, and more specifically to an uninter-                     BRIEF DESCRIPTION OF THE DRAWINGS
ruptible power supply socket capable of adapting a 6 volt
battery.                                                              FIG. 1 illustrates a block diagram of the UPS socket of the
                                                                 10 present invention;
             BACKGROUND OF THE INVENTION                              FIG. 2 illustrates the construction members of the UPS
                                                                    socket of the present invention;
   Conventional UPS devices use 12 volt batteries as main             FIG. 3 illustrates the upper and lower covers with relevant
power supply to cope with large power consumption                   components in the UPS socket of the present invention;
required by ICs especially circuits of switching power           15   FIG. 4 illustrates the external views of the UPS socket of
supply and circuits of inverters. Due to this large power           the present invention;
consumption, the sizes of transformers, ICs and other com-            FIG. 5 illustrates the circuit diagram of the power circuit
ponents of conventional UPS devices are large; and there-           board of the UPS socket of the present invention;
fore, conventional UPS devices have notable drawbacks                 FIG. 6 illustrates the circuit diagram of the control circuit
such as high cost, difficult maintenance and not being           20 board of the UPS socket of the present invention; and
portable.                                                             FIG. 7 illustrates the circuit diagram of the surge protec-
                                                                    tion circuit board of the UPS socket of the present invention.
           SUMMARY OF THE PRESENT INVENTION
                                                                                    THE PREFERRED EMBODIMENTS
   The UPS socket of the present invention uses a central        25
processor unit (CPU) and a rechargeable circuit for boosting           In FIG. 1, the block diagram of the UPS socket of the
its power efficiency, and therefore is capable of solving the       present invention includes a power circuit board 2f-1, a
drawbacks associated with the prior art mentioned above.            control circuit board 2f-2 and a surge protection circuit board
   A feature of the UPS socket of the present invention is to       2f-3; FIG. 1 simply illustrates the connection relations
use a 6 volt battery to provide the power supply for the         30 among the circuit boards, and the detailed description of its
equipment during the interruption of consumer electricity           installation will be given in FIG. 2 and FIG. 3 respectively.
comprising a power circuit board, a control circuit board and         In FIG. 2, the construction members of UPS socket of the
a surge protection circuit board.                                   present invention consists of a front panel 2a viewed from
   Another feature of the present invention is that the size of  35 the bottom, including a name plate 1, 3 sets of bypass UPS
its configuration is similar to commercial extension sockets,       receptacle 2, wherein one of which is surge protection
and its size is much smaller than conventional UPS, yet             receptacle 2-1, 3 sets of UPS receptacle, wherein one of
capable of providing 3 sets of surge protection receptacles         which is surge protection receptacle 3-1, an indicator lamp
and 3 sets of UPS receptacle on the surface panel of the UPS        4, a power switch 5, an upper cover 2b1, a power breaker
socket. When electricity is interrupted, the function of CPU     40 2b2, a receptacle member 2b4, a wiring insulation plate 2b5,
controls may automatically save the application and data and        a battery set 2e, a print circuit board assembly 2f and a
then close the program to reduce power consumption. If              detachable lower cover 2g consisting of a power circuit
electricity is not restored within a few minutes and there is       board 2f-1, a control circuit board 2f-2 and a surge protection
no substitute emergency power available, the CPU will               circuit board 2f-3.
automatically shut down the operating system of the com-         45   As shown in FIG. 2, an uninterruptible power supply
puter to avoid losing data in the process.                          socket comprising an upper cover 3a, a lower cover 3b
   Another feature of the present invention is its compact          consisting of a first part 2g-1 and a second part 2g-2, a
modular construction capable of saving assembly and main-           battery 2e, a power circuit board 2f-1, a control circuit board
tenance time cost and improve quality of the UPS socket.            2f-2 and a surge protection circuit board 2f-3, wherein the
   In a preferred embodiment of the present invention, the       50 first part 2g-1 of the lower cover 2g forming a first cavity
construction members is comprising of a face panel, an              with first half of the upper cover 2b1, the second part 2g-2
upper cover, a socket member, a wiring insulation plate, a          of the lower cover 2g forming a second cavity with second
battery set, a print circuit board assembly, a detachable lower     half of the upper cover 2b-1, and wherein said control circuit
cover, a power cord lead and several components, wherein            board 2f-2 and said surge protection board 2f-3 both erected
said upper and lower covers are connected via several            55 on said power circuit board 2f-1 forming a U shape circuit
electric conductive wires.                                          board assembly 2f mounted in the first cavity. As shown in
   The UPS socket of the present invention in general               FIG. 2, the lower cover 2g and the upper cover 2b1 are thus
contains a print circuit board assembly consisting of a power       constructed to form an elliptical box, and the first part 2g-1
circuit board, a control circuit board and a surge protection       of the lower cover 2g is combined with the second part 2g-2
circuit board, wherein said power circuit board includes an     60  of the lower cover 2g.
AC/DC rectifier, a DC/DC inverter, a switch controller, a             FIG. 3, illustrates the upper and lower covers with its
rechargeable charger, a DC/DC direct current bus booster, an        relevant components positions in the UPS socket of the
output inverter and a computer transmission interface cir-          present invention. The upper cover 3a includes a battery 1
cuit. In addition, said control circuit board includes a moni-      mounting space, a wiring isolation plate 2, and a power
tor, a charge controller, a DC/DC controller, an output         65  breaker 3. Still referring to FIG. 3, the lower portion shows
inverter driver and a CPU; and said surge protector includes        a lower cover 3b, which includes a battery mounting space,
a set of surge suppression circuits.                                a print circuit board assembly 2, which includes a power circuit board 2-1, a control circuit board 2-2 and a surge protection circuit board 2-3, and a power breaker with power cord lead 3.

FIG. 4 illustrates external views of the UPS socket of the present invention, wherein the upper part 4a of FIG. 4 is shown a front view of the UPS socket of the present invention, two rows of receptacle are shown in the middle, the upper side has 3 sets of bypass receptacle 2-2, the lower side has 3 sets of UPS receptacle, at right side is a power indicator lamp 4, a power switch 5, and a power cord lead 3, and at left side is a template 1. Still referring to FIG. 4 the middle part of the FIG. 4 is shown a rear view 4b of the UPS socket of the present invention; the lower part of the FIG. 4 is shown a lower cover in its separate status 4c, including a detachable battery cover 1, a detachable cover 2, a power cord lead 3, an upper cover 4, and 3 sets of communication interface receptacle 5.

Referring to FIGS. 5, 6 and 7, and except for a rechargeable circuit in FIG. 5 which was filed in a separate application by the applicant, the rest of the circuits are known in the field, thus no further descriptions are prepared herein.

Various modifications of the embodiments specifically illustrated and described herein will be apparent to those skilled in the art, particularly in light of the teaching of this invention. The present invention should not be construed as limited to the specific form and examples as shown and described, but instead is set forth the following claims.

What is claimed is:

1. An uninterruptible power supply socket comprising an upper cover, a lower cover consisting of a first part and a second part, a battery, a power circuit board, a control circuit board and a surge protection circuit board; wherein the first part of the lower cover forming a first cavity with a first half of the upper cover, the second part of the lower cover forming a second cavity with a second half of the upper cover; and said control circuit board and said surge protection board both erected on said power circuit board forming a U shape circuit board assembly mounted in the second cavity.

2. The socket according to claim 1, wherein the lower cover and the upper cover are thus constructed to form an elliptical box.

3. The socket according to claim 1, wherein the battery is mounted in the first cavity.

* * * * *